(12) United States Patent
Miyake et al.

(10) Patent No.: US 9,935,612 B2
(45) Date of Patent: Apr. 3, 2018

(54) LADDER-TYPE FILTER, DUPLEXER, AND MODULE

(71) Applicant: TAIYO YUDEN CO., LTD., Tokyo (JP)

(72) Inventors: Tomoyuki Miyake, Tokyo (JP); Naoki Takahashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 18 days.

(21) Appl. No.: 15/084,229

(22) Filed: Mar. 29, 2016

(65) Prior Publication Data

US 2016/0365844 A1 Dec. 15, 2016

(30) Foreign Application Priority Data

Jun. 9, 2015 (JP) .................................. 2015-117009

(51) Int. Cl.
*H03H 9/70* (2006.01)
*H03H 9/72* (2006.01)
(Continued)

(52) U.S. Cl.
CPC ............ *H03H 9/706* (2013.01); *H03H 9/542* (2013.01); *H03H 9/568* (2013.01); *H03H 9/605* (2013.01); *H03H 9/6483* (2013.01); *H03H 9/725* (2013.01)

(58) Field of Classification Search
CPC ........ H03H 9/542; H03H 9/568; H03H 9/605; H03H 9/6483; H03H 9/706; H03H 9/725
(Continued)

(56) References Cited

U.S. PATENT DOCUMENTS

2004/0248542 A1* 12/2004 Heuermann ............. H03H 7/42
455/339
2008/0100397 A1* 5/2008 Nam ...................... H03H 9/706
333/133
(Continued)

FOREIGN PATENT DOCUMENTS

JP 2002-300003 A 10/2002
JP 2003-069382 A 3/2003
(Continued)

OTHER PUBLICATIONS

Japanese Office Action dated Feb. 13, 2018, in a counterpart Japanese patent application No. 2015-117009. (A machine translation (not reviewed for accuracy) attached.).

*Primary Examiner* — Barbara Summons
(74) *Attorney, Agent, or Firm* — Chen Yoshimura LLP

(57) ABSTRACT

A ladder-type filter includes: one or more series resonators connected in series between an input terminal and an output terminal; two or more parallel resonators connected in parallel between the input terminal and the output terminal; and a path that electrically connects ground terminals of the two or more parallel resonators to each other, electrically connects to ground through only a ground terminal of a parallel resonator located closest to the input terminal or to the output terminal, and includes at least two inductors connected in series in at least two positions of positions between the ground terminals of the two or more parallel resonators and a position between the ground terminal of the parallel resonator located closest to the input terminal or to the output terminal and the ground.

8 Claims, 12 Drawing Sheets

(51) Int. Cl.
  *H03H 9/54* (2006.01)
  *H03H 9/64* (2006.01)
  *H03H 9/56* (2006.01)
  *H03H 9/60* (2006.01)

(58) Field of Classification Search
  USPC .............................. 333/133, 189, 193, 195
  See application file for complete search history.

(56) References Cited

U.S. PATENT DOCUMENTS

| | | | |
|---|---|---|---|
| 2008/0136555 A1* | 6/2008 | Schmidhammer | H03H 9/0028 333/129 |
| 2008/0238572 A1 | 10/2008 | Funami et al. | |
| 2010/0026414 A1* | 2/2010 | Iwaki | H03H 9/725 333/100 |
| 2010/0188166 A1* | 7/2010 | Hara | H03H 9/542 333/133 |
| 2011/0248794 A1 | 10/2011 | Klamm et al. | |
| 2012/0274416 A1 | 11/2012 | Hara et al. | |

FOREIGN PATENT DOCUMENTS

| | | |
|---|---|---|
| JP | 2006-270570 A | 10/2006 |
| JP | 2008-271511 A | 11/2008 |
| JP | 2010-177770 A | 8/2010 |
| JP | 2012-506185 A | 3/2012 |
| JP | 2012-231437 A | 11/2012 |
| WO | 2007-015331 A1 | 2/2007 |

* cited by examiner

Comparative Example

Comparative Example

LADDER-TYPE FILTER, DUPLEXER, AND MODULE

CROSS-REFERENCE TO RELATED APPLICATION

This application is based upon and claims the benefit of priority of the prior Japanese Patent Application No. 2015-117009, filed on Jun. 9, 2015, the entire contents of which are incorporated herein by reference.

FIELD

A certain aspect of the present invention relates to a ladder-type filter, a duplexer, and a module.

BACKGROUND

Ladder-type filters are used in high frequency communication systems. It has been known to connect an inductor between a parallel resonator of a ladder-type filter and ground as disclosed in Japanese Patent Application Publication Nos. 2012-231437 and 2002-300003 and International Publication No. 2007-015331. It has been also known to unify and connect ground terminals of parallel resonators to ground as disclosed in Japanese Patent Application Publication Nos. 2012-506185, 2008-271511, and 2003-069382.

The connection of an inductor between a parallel resonator and ground improves attenuation characteristics. As the number of inductors is increased, the attenuation characteristics are improved more. However, multiple large inductors make it difficult to reduce the size of the ladder-type filter.

SUMMARY OF THE INVENTION

According to a first aspect of the present invention, there is provided a ladder-type filter including: one or more series resonators connected in series between an input terminal and an output terminal; two or more parallel resonators connected in parallel between the input terminal and the output terminal; and a path that electrically connects ground terminals of the two or more parallel resonators to each other, electrically connects to ground through only a ground terminal of a parallel resonator located closest to the input terminal or to the output terminal, and includes at least two inductors connected in series in at least two positions of positions between the ground terminals of the two or more parallel resonators and a position between the ground terminal of the parallel resonator located closest to the input terminal or to the output terminal and the ground.

According to a second aspect of the present invention, there is provided a duplexer including: a transmit filter; and a receive filter, wherein at least one of the transmit filter and the receive filter is the above ladder-type filter.

According to a third aspect of the present invention, there is provided a module including: at least one of the above ladder-type filter and the above duplexer.

DETAILED DESCRIPTION

Figure 1A:
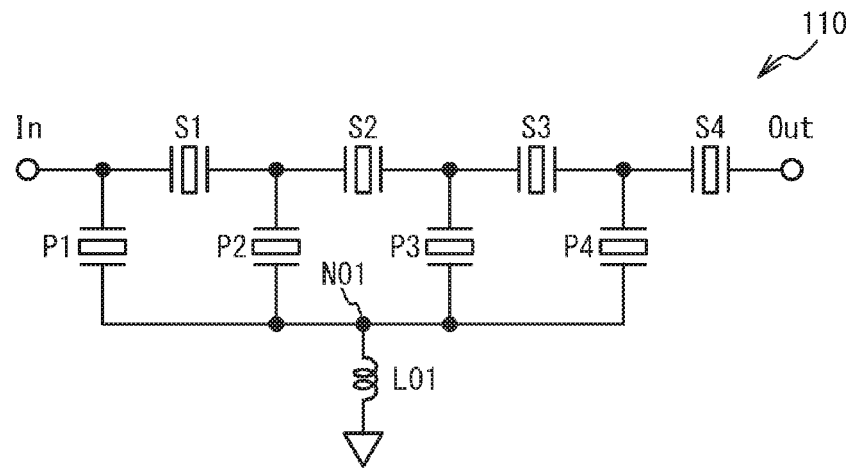
FIG. 1A and FIG. 1B are circuit diagrams of ladder-type filters in accordance with first and second comparative examples, respectively.
Figure 1B:
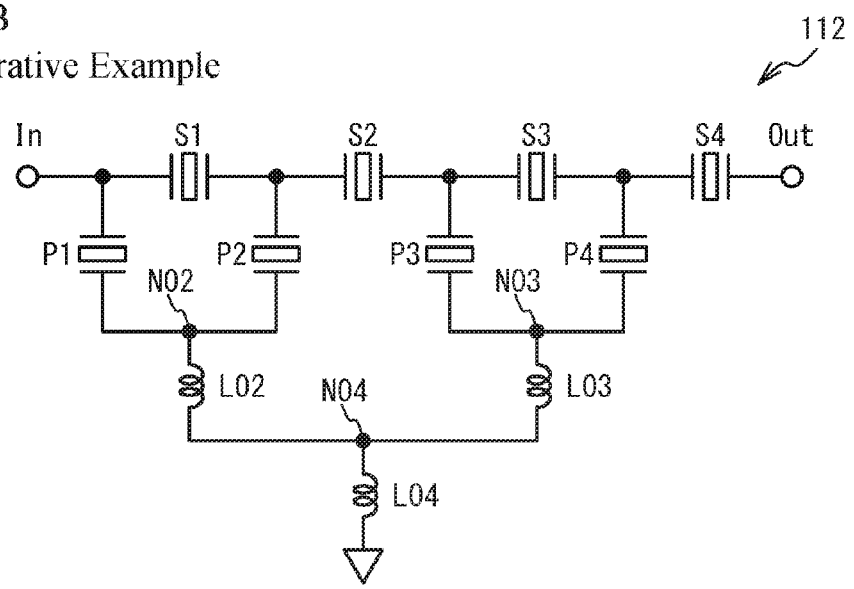

FIG. 1A and FIG. 1B are circuit diagrams of ladder-type filters in accordance with first and second comparative examples, respectively. As illustrated in FIG. 1A, a ladder-type filter 110 includes one or more series resonators S1 through S4, two or more parallel resonators P1 through P4, and an inductor L01. The one or more series resonators S1 through S4 are electrically connected in series between an input terminal In and an output terminal Out. The parallel resonators P1 through P4 are electrically connected in parallel between the input terminal In and the output terminal Out. The ground terminals of the parallel resonators P1 through P4 are commonly connected to a node N01. The inductor L01 is electrically connected between the node N01 and ground.

As illustrated in FIG. 1B, in a ladder-type filter 112, the ground terminals of the parallel resonators P1 and P2 are commonly electrically connected to a node N02. The ground terminals of the parallel resonators P3 and P4 are commonly electrically connected to a node N03. An inductor L02 is electrically connected between the node N02 and a node N04. An inductor L03 is electrically connected between the node N03 and the node N04. An inductor L04 is connected between the node N04 and ground. Other configurations are the same as those of the first comparative example, and thus the description thereof is omitted.

Simulated were attenuation characteristics of the ladder-type filters in accordance with the first and second comparative examples. The series resonators S1 through S4 and the parallel resonators P1 through P4 were assumed to be surface acoustic wave resonators using a bandpass filter having a passband around 810 to 835 MHz. The inductances of the inductors in the first comparative example and the second comparative example were configured as follows.

First comparative example: L01=50 pH

Second comparative example: L02=0.7 nH, L03=0.7 nH, L04=10 pH

Figure 2:
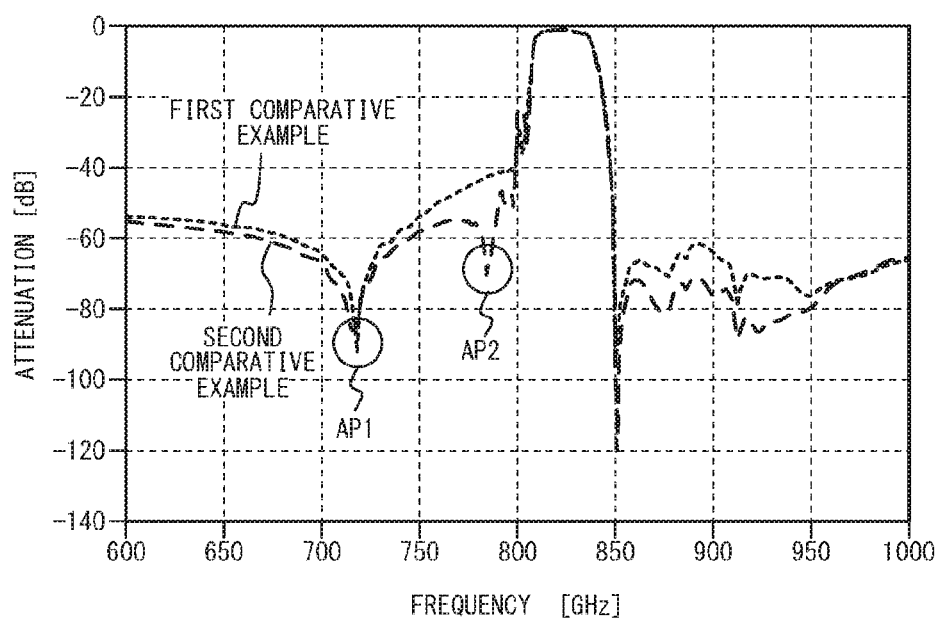
FIG. 2 illustrates attenuation characteristics of the ladder-type filters of the first and second comparative examples.

FIG. 2 illustrates attenuation characteristics of the ladder-type filters of the first and second comparative examples. As illustrated in FIG. 2, an attenuation pole AP1 is formed at approximately 720 MHz in both the ladder-type filters of the first and second comparative examples. An attenuation pole AP2 is formed around 785 MHz in the ladder-type filter of the second comparative example. As described above, the connection of an inductor between the parallel resonators P1 through P4 and ground allows an attenuation pole to be formed at a desired frequency. The provision of two or more inductors as described in the second comparative example allows two or more attenuation poles to be formed. Accordingly, the attenuation characteristic is improved. The second comparative example improves the attenuation characteristic widely at frequencies lower than the passband.

However, an inductor having a large inductance needs a large mount area. Therefore, the size of the ladder-type filter is difficult to reduce.

First Embodiment

Figure 3:
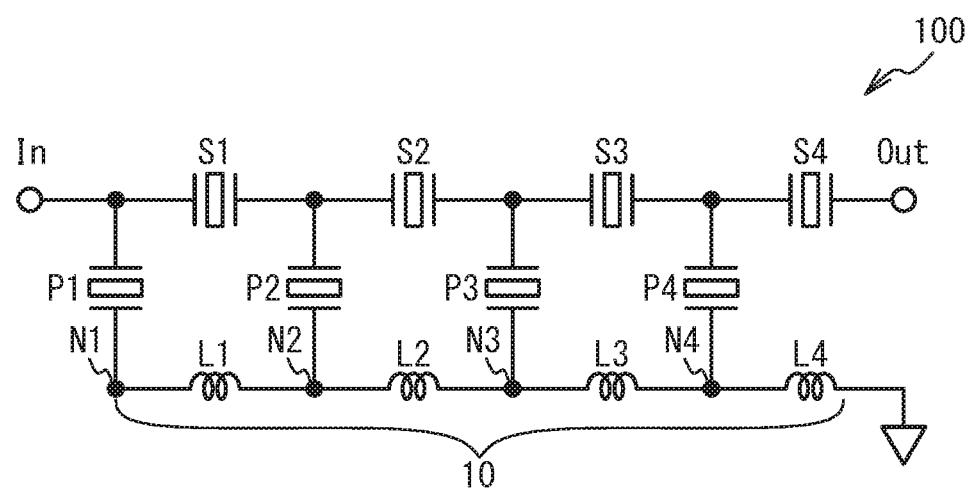
FIG. 3 is a circuit diagram of a ladder-type filter in accordance with a first embodiment.

FIG. 3 is a circuit diagram of a ladder-type filter in accordance with a first embodiment. As illustrated in FIG. 3, a ladder-type filter 100 includes the series resonators S1 through S4 connected in series between the input terminal In and the output terminal Out, and the parallel resonators P1 through P4 connected in parallel between the input terminal In and the output terminal Out. The ground terminals that are ground-side terminals of the parallel resonators P1 through P4 are respectively electrically connected to nodes N1 through N4. In FIG. 3, the adjacent nodes N1 through N4 are interconnected in this order to form a single path. That is to say, the ground terminals are electrically interconnected. The ground terminal of the parallel resonator P4 located closest to the output terminal Out is connected to ground, and there is no other path connected to ground without passing through the ground terminal of the parallel resonator P4. As described above, the node N4 is connected to ground. An inductor L1 is electrically connected between the nodes N1 and N2. An inductor L2 is electrically connected between the nodes N2 and N3. An inductor L3 is electrically connected between the nodes N3 and N4. An inductor L4 is electrically connected between the node N4 and ground. A path 10 includes all the inductors L1 through L4, and is from the inductor L4 connected to ground to the node N1 connected to the ground terminal of the parallel resonator P1 located farthest from the inductor L4.

Figure 4:
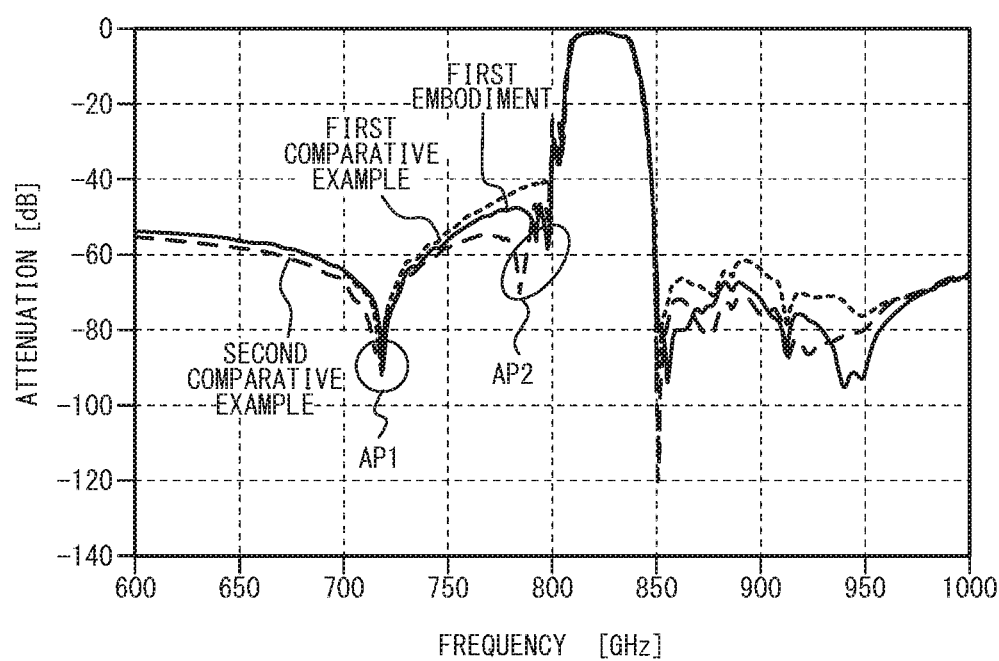
FIG. 4 illustrates attenuation characteristics of the ladder-type filters of the first embodiment, and the first and second comparative examples.

Simulated was the attenuation characteristic of the ladder-type filter in accordance with the first embodiment. The inductances of the inductors in the first embodiment were configured as follows.
L1=0.4 nH, L2=0.3 nH, L3=0.2 nH, L4=10 pH FIG. 4 illustrates attenuation characteristics of the ladder-type filters of the first embodiment, and the first and second comparative examples. As illustrated in FIG. 4, the ladder-type filter of the first embodiment has the attenuation pole AP1 formed around 720 MHz as with those of the first and second comparative examples. As with in the second comparative example, the attenuation pole AP2 is also formed around 780 MHz in the first embodiment.

As described above, the first embodiment has two attenuation poles as with the second comparative example. In the second comparative example, the sum of the inductances of the inductors L02 through L04 is 1.41 nH. On the other hand, in the first embodiment, the sum of the inductances of the inductors L1 through L4 is 0.91 nH. The first embodiment allows the inductance of the inductor to be less than that of the second comparative example. Therefore, the first embodiment decreases the mount area of the inductors, and reduces the ladder-type filter in size.

Figure 5:
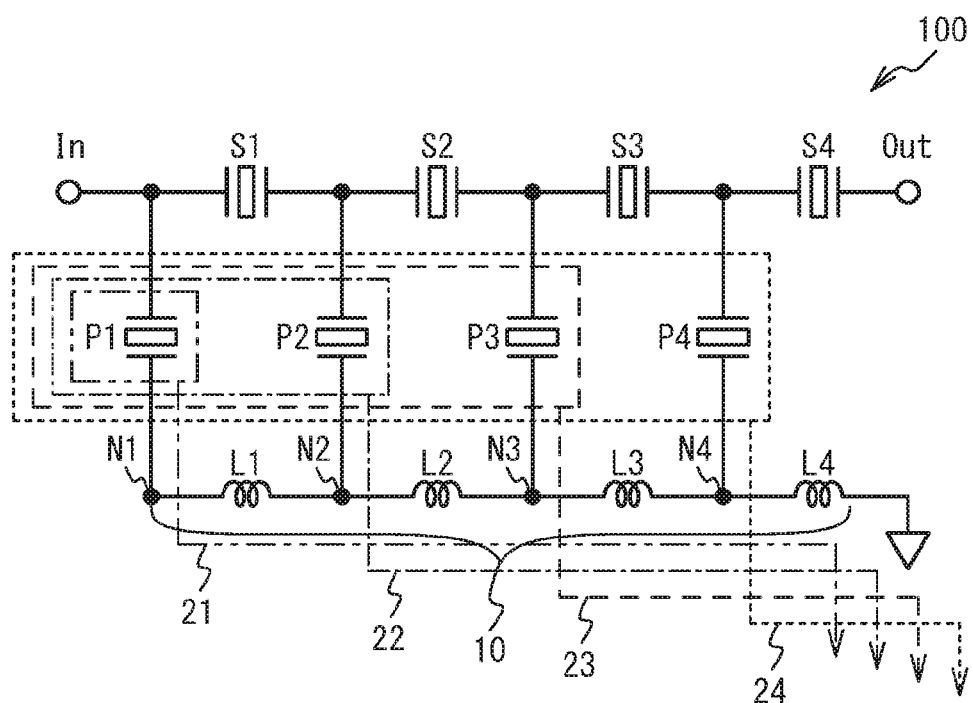
FIG. 5 illustrates the relation of the connection among the inductances of inductors of the first embodiment.

FIG. 5 illustrates the relation of connection among the inductances of the inductors in the first embodiment. As illustrated in FIG. 5, in the first embodiment, the parallel resonator P1 is electrically connected to ground through the inductors L1 through L4 as indicated by a grounding path 21. The parallel resonators P1 and P2 are electrically connected to ground through the inductors L2 through L4 as indicated by a grounding path 22. The parallel resonators P1 through P3 are electrically connected to ground through the inductors L3 and L4 as indicated by a grounding path 23. The parallel resonators P1 through P4 are electrically connected to ground through the inductor L4 as indicated by a grounding path 24. This configuration allows the four grounding paths 21 through 24 to have different inductances. Accordingly, the parallel resonators P1 through P4 can be grounded through two or more different inductance components, and two or more attenuation poles are thus formed. The inductor L4 is shared by the four grounding path 21 through 24, the inductor L3 is shared by the grounding paths 21 through 23, and the inductor L2 is shared by the grounding paths 21 and 22. As described above, since the inductors L2 through L4 are shared by two or more grounding paths 21 through 24, the sum of the inductances of the inductors L1 through L4 are reduced. Therefore, the use of two or more attenuation poles improves the attenuation characteristic, reduces the mount area of inductors, and reduces the ladder-type filter in size.

In the first embodiment, the path 10 electrically connects the ground terminals of the parallel resonators P1 through P4 in the order of arrangement of the parallel resonators P1 through P4. The path 10 is electrically connected to ground through only the ground terminal of the parallel resonator P4 located closest to the output terminal Out. That is to say, there is no path that allows the nodes N1 through N3 to be electrically connected to ground without the node N4. The inductor L1 is electrically connected in series between the ground terminals of the parallel resonators P1 and P2, the inductor L2 is electrically connected in series between the ground terminals of the parallel resonators P2 and P3, the inductor L3 is electrically connected in series between the ground terminals of the parallel resonators P3 and P4, and the inductor L4 is electrically connected in series between the ground terminal of the parallel resonator P4 located closest to the output terminal Out and ground. This configuration allows two or more attenuation poles with different frequencies to be formed by the inductors L1 through L4, improving the attenuation characteristic. The inductors L2 through L4 are shared by the grounding paths 21 through 24. This configuration thus reduces the mount area of the inductors L1 through L4, thereby reducing the ladder-type filter in size.

Figure 6A:
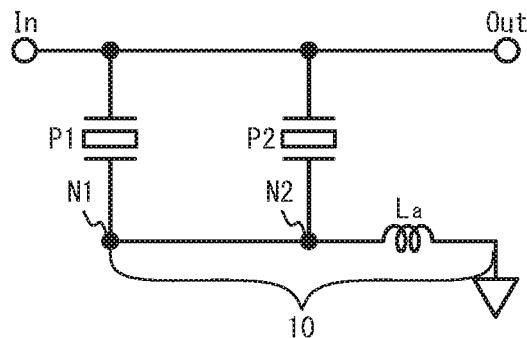
FIG. 6A through FIG. 6D illustrate parallel arm circuits of the ladder-type filter.
Figure 6B:
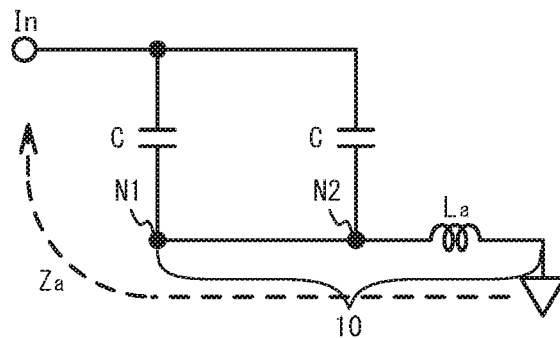

The preferable value of the inductance between the inductors will be studied. FIG. 6A and FIG. 6B illustrate parallel arm circuits of the ladder-type filter. FIG. 6A illustrates a parallel arm with parallel resonators, and FIG. 6B equivalently illustrates the parallel arm with capacitors. As illustrated in FIG. 6A, the parallel resonators P1 and P2 are connected in parallel between the input terminal In and the output terminal Out. The ground terminals of the parallel resonators P1 and P2 are respectively connected to the nodes N1 and N2. The nodes N1 and N2 are commonly connected to ground through an inductor $L_a$. As illustrated in FIG. 6B, assume that the parallel resonators P1 and P2 are equivalently capacitors C. For the sake of shorthand, the parallel resonators P1 and P2 have the same equivalent capacitance of C.

Impedance $Z_a$ viewed from the input terminal In to the ground side is expressed by the equation (1).

$$Z_a = -j\frac{1}{2\omega C} + j\omega L_a \quad (1)$$

Angular frequency $\omega_a$ at which an attenuation pole is formed is expressed by the equation (2).

$$\omega_a^2 = \frac{1}{L_a \cdot 2C} \quad (2)$$

Figure 6C:
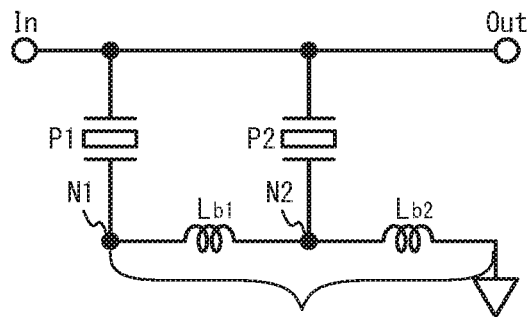
Figure 6D:
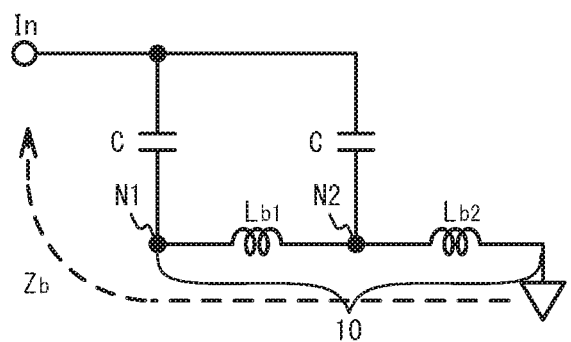

Assume that an inductor $L_{b1}$ is connected between the nodes N1 and N2, and an inductor $L_{b2}$ is connected between the node N2 and ground as illustrated in FIG. 6C. Assume that the parallel arm is equivalently a capacitor C as illustrated in FIG. 6D. Impedance $Z_b$ viewed from the input terminal In to the ground side is expressed by the equation (3).

$$Z_b = \frac{\left(j\omega L_{b1} - j\frac{1}{\omega C}\right) \cdot \left(-j\frac{1}{\omega C}\right)}{\left(j\omega L_{b1} - j\frac{1}{\omega C}\right) - j\frac{1}{\omega C}} + j\omega L_{b2}$$

$$= j\frac{\omega^2 L_{b1} L_{b2} - \frac{2}{C}\left(L_{b2} + \frac{L_{b1}}{2}\right) + \frac{1}{\omega^2 C^2}}{\omega L_{b1} - \frac{2}{\omega C}} \quad (3)$$

Angular frequency $\omega_b$ at which an attenuation pole is formed is expressed by the equation (4).

$$\omega_b^2 = \frac{\left(1 + \frac{2L_{b2}}{L_{b1}}\right) + \sqrt{1 + \left(\frac{2L_{b2}}{L_{b1}}\right)^2}}{L_{b2} \cdot 2C} \quad (4)$$

Here, in FIG. 6C, the attenuation pole is formed at the position same as that of FIG. 6A when $\omega_1$ is equal to $\omega_b$ ($\omega_1 = \omega_b$). When $L_{b1}$ is equal to $L_{b2}$, $L_{b1}$ and $L_{b2}$ are expressed by the equation (5).

$$L_{b1} = L_{b2} = (3-\sqrt{5}) \cdot L_a \omega_b^2 \quad (5)$$

The relationship between $L_{b1}$ and $L_{b2}$ includes three conditions: $L_{b1} > L_{b2}$; $L_{b1} < L_{b2}$; and $L_{b1} = L_{b2}$. From the equation (5), $L_{b1}$ and $L_{b2}$ are expressed by the equation (6) under the above three conditions.

$$2L_a > L_{b1} > (3-\sqrt{5}) \cdot L_a > L_{b2}$$

$$L_a > L_{b2} > (3-\sqrt{5}) \cdot L_a > L_{b1}$$

$$L_{b1} = L_{b2} = (3-\sqrt{5}) \cdot L_a \quad (6)$$

Figure 7:
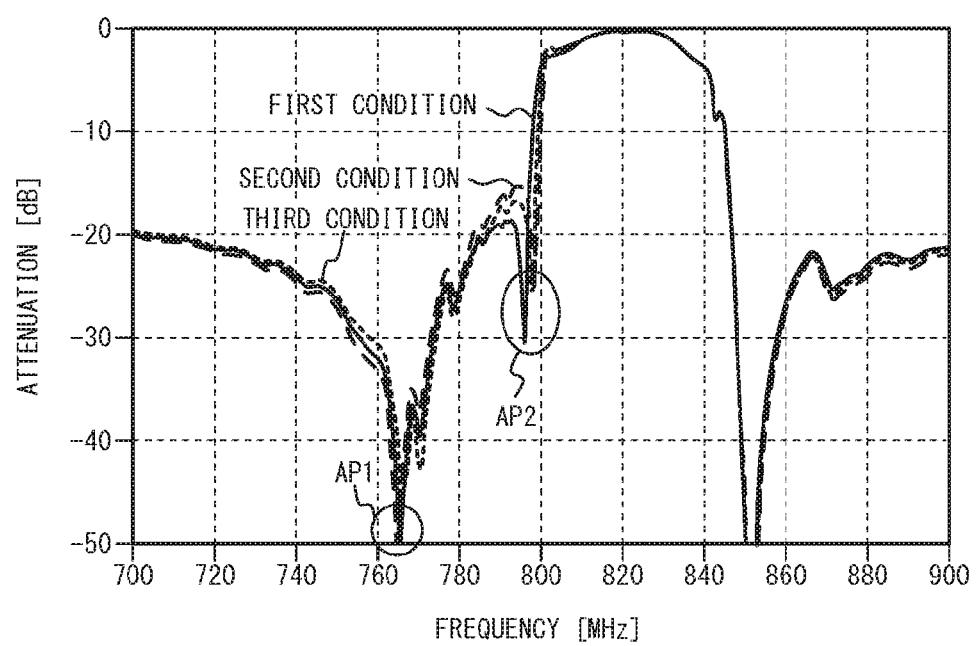
FIG. 7 illustrates attenuation characteristics under first through third conditions.

Under the following three conditions, simulated were attenuation characteristics of FIG. 6C.
First condition: $L_{b1} > L_{b2}$
$L_{b1}$=2.5 nH, $L_{b2}$=0.5 nH
Second condition: $L_{b1} < L_{b2}$
$L_{b1}$=0.4 nH, $L_{b2}$=1.0 nH
Third condition: $L_{b1} = L_{b2}$
$L_{b1}$=0.84 nH, $L_{b2}$=0.84 nH FIG. 7 illustrates attenuation characteristics under the first through third conditions. As illustrated in FIG. 7, the attenuation characteristic of the attenuation pole AP1 is almost the same under the first through third conditions. The attenuation characteristic of the attenuation pole AP2 is best under the first condition, second-best under the third condition, and third-best under the second condition.

As described above, for the inductors $L_{b1}$ and $L_{b2}$ in the path 10, the inductance of the inductor $L_{b2}$ located closer to ground is preferably less than that of the inductor $L_{b1}$. For example, in the first embodiment, the relationship among the magnitudes of the inductances of the inductors L1 through L4 is preferably L1≥L2≥L3≥L4. For example, it may be L1=L2=L>L4. Alternatively, it may be L1=L2>L3>L4. Alternatively, it may be L1>L2>L3>L4. That is to say, the inductor L4 located closest to ground preferably has an inductance less than the inductance of the inductor L1 located farthest from the ground. Furthermore, the inductor located closer to ground of the adjacent inductors preferably has an inductance less than or equal to the inductance of the other inductor with respect to all adjacent inductors of the inductors L1 through L4. This configuration improves the attenuation characteristic as illustrated in FIG. 7. The case where the number of inductors is four has been described, but the same applies to the case where the number of inductors is two or greater.

Figure 8A:
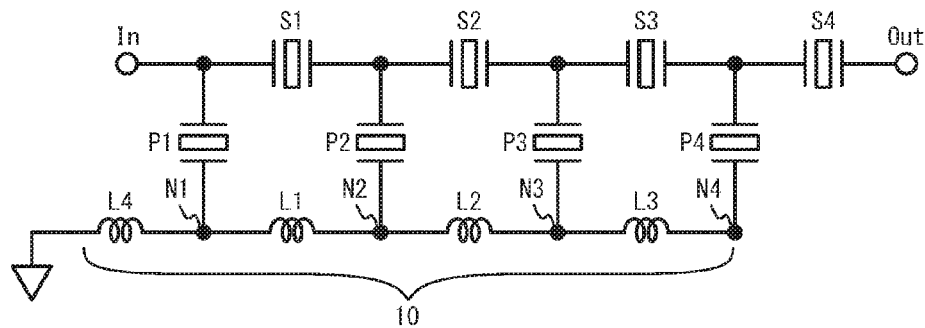
FIG. 8A and FIG. 8C are circuit diagrams of ladder-type filters in accordance with first through third variations of the first embodiment, respectively.

FIG. 8A through FIG. 10C are circuit diagrams of ladder-type filters in accordance with first through eighth variations of the first embodiment. As illustrated in FIG. 8A, the inductor L4 is connected between the node N1 and ground. Other configurations are the same as those of the first embodiment, and thus the description is omitted. As described above, the path 10 may be connected to ground through only the ground terminal of the parallel resonator P1 located closest to the input terminal In.

Figure 8B:
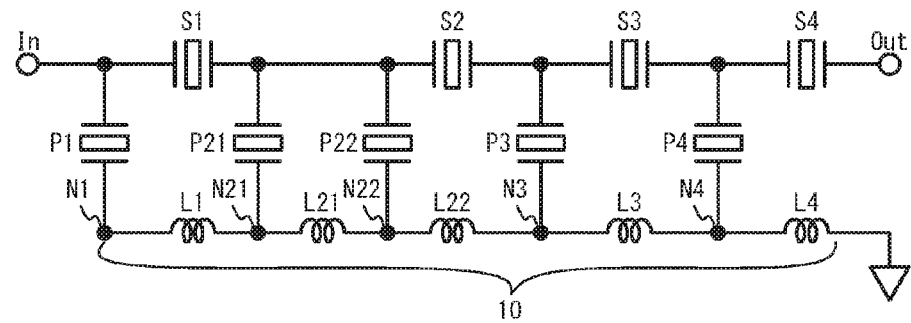

As illustrated in FIG. 8B, the parallel resonator P2 is divided into parallel resonators P21 and P22. The ground terminals of the parallel resonators P21 and P22 are respectively connected to the nodes N21 and N22. An inductor L21 is connected between the nodes N21 and N22. An inductor L22 is connected between the nodes N22 and N3. Other configurations are the same as those of the first embodiment, and the description is omitted. As described above, when the parallel resonator P2 is divided, the inductor L21 may be connected between the ground terminals of the divided parallel resonators P21 and P22. The inductor L21 may be omitted. The same applies to the case where the resonator other than the parallel resonator P2 is divided.

Figure 8C:
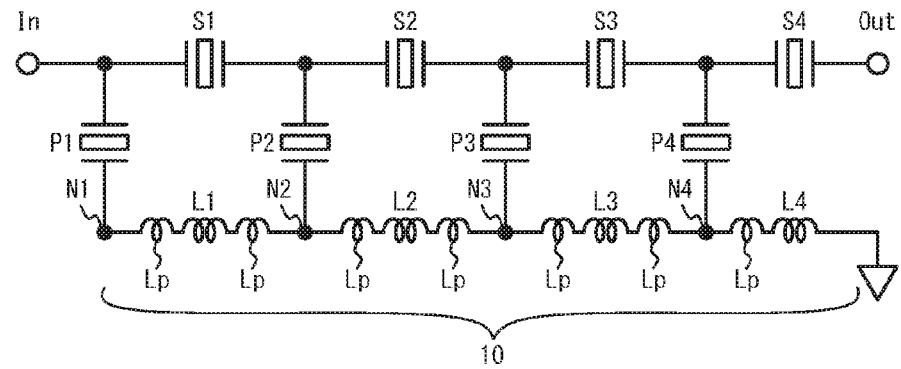

As illustrated in FIG. 8C, parasitic inductances Lp such as bumps, wires, and/or wiring lines are connected between the inductors L1 through L4 and the nodes N1 through N4. Other configurations are the same as those of the first embodiment, and the description is omitted. As illustrated in FIG. 8C, the parasitic inductance Lp may be connected to at least one of the inductors L1 through L4.

Figure 9A:
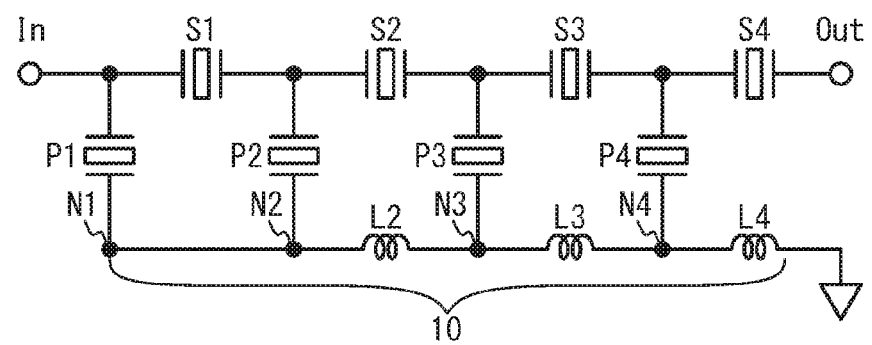
FIG. 9A and FIG. 9B are circuit diagrams of ladder-type filters in accordance with fourth and fifth variations of the first embodiment, respectively.
Figure 9B:
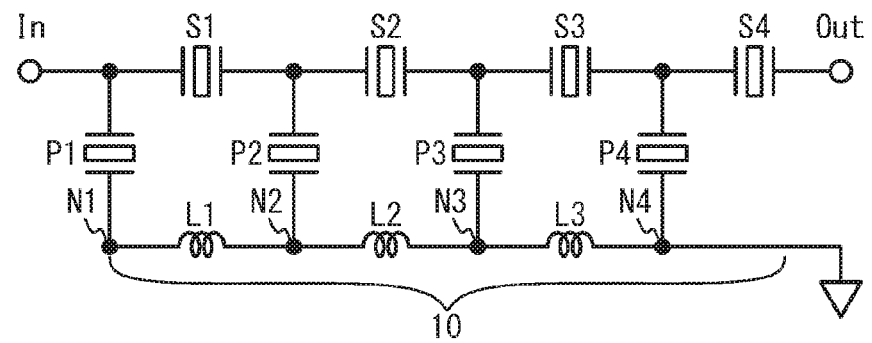
Figure 10A:
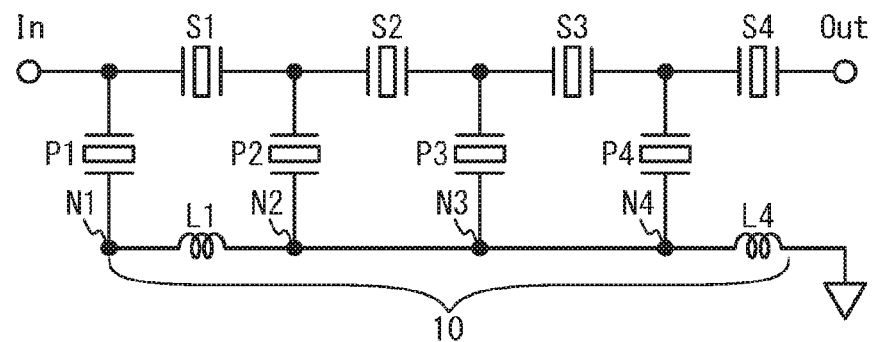
FIG. 10A through FIG. 10C are circuit diagrams of ladder-type filters in accordance with sixth through eighth variations of the first embodiment, respectively.
Figure 10B:
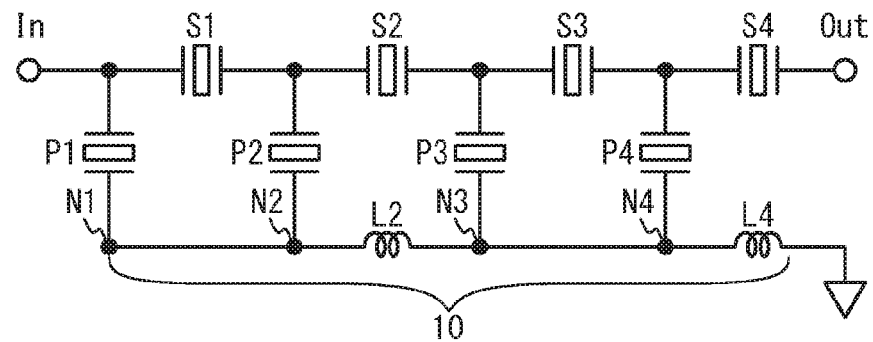
Figure 10C:
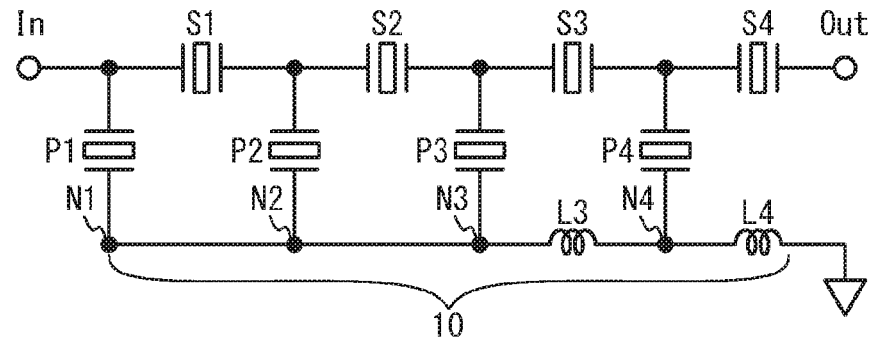

As illustrated in FIG. 9A, the inductor L1 is not connected between the nodes N1 and N2. As illustrated in FIG. 9B, the inductor L4 is not connected between the node N4 and ground. As illustrated in FIG. 10A, the inductor L2 is not connected between the nodes N2 and N3, and the inductor L3 is not connected between the nodes N3 and N4. As illustrated in FIG. 10B, the inductor L1 is not connected between the nodes N1 and N2, and the inductor L3 is not connected between the nodes N3 and N4. As illustrated in FIG. 10C, the inductor L1 is not connected between the nodes N1 and N2, and the inductor L2 is not connected between the nodes N2 and N3. Other configurations are the same as those of the first embodiment, and thus the description is omitted.

As illustrated in FIG. 9A through FIG. 10C, the path 10 is required to include at least two inductors connected in series in at least two positions of the position between the ground terminals of the parallel resonators P1 and P2, the position between the ground terminals of the parallel resonators P2 and P3, the position between the ground terminals of the parallel resonators P3 and P4, and the position between the ground terminal of the parallel resonator P4 closest to the output terminal Out (or the ground terminal of the parallel resonator located closest to the input terminal In) and ground. At this time, the inductor located closer to ground of adjacent inductors has an inductance less than or equal to the inductance of the other inductor with respect to all adjacent inductors of at least two inductors This configuration improves the attenuation characteristic as illustrated in FIG. 7.

As illustrated in FIG. 9A, the path 10 includes at least one inductors L2 and L3 (a first inductor) connected in series between the ground terminals of the two or more parallel resonators, and an inductor (a second inductor) connected in series between the ground terminal of the parallel resonator P4 and ground. At this time, the inductance of the inductor L4 is preferably less than inductances of the inductors L2 and L3. This configuration improves the attenuation characteristic as with FIG. 7.

As illustrated in FIG. 9B, the path 10 includes at least two inductors L1 through L3 connected in series between the ground terminals of the parallel resonators P1 through P4. With respect to all adjacent inductors of the inductors L1 through L3, the inductor located closer to ground of the adjacent inductors has an inductance less than the inductance of the other inductor. This configuration improves the attenuation characteristic as with FIG. 7.

In the first embodiment and the variations thereof, the number of the parallel resonators P1 through P4 is four, but the number of the parallel resonators is to be two or more. To improve the attenuation characteristic, the number of inductors is preferably large. The number of the parallel resonators is preferably three or more, more preferably four or more. The number of the inductors is preferably three or more, more preferably four or more. The series resonators S1 through S4 and the parallel resonators P1 through P4 may be acoustic resonators such as, for example, acoustic wave surface resonators, acoustic wave boundary wave resonators, Love wave resonators, or piezoelectric thin film resonators.

Second Embodiment

A second embodiment applies the first embodiment and the variations thereof to a duplexer, and a first variation of the second embodiment applies the first embodiment and the variations thereof to a module.

Figure 11:
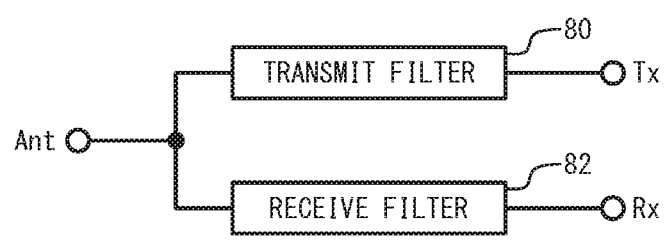
FIG. 11 is a block diagram of a duplexer in accordance with a second embodiment.

FIG. 11 is a block diagram of a duplexer in accordance with the second embodiment. As illustrated in FIG. 11, a transmit filter 80 is connected between an antenna terminal Ant and a transmit terminal Tx, and a receive filter 82 is connected between the antenna terminal Ant and a receive terminal Rx. The transmit filter 80 transmits signals within the transmit band, among signals input from the transmit terminal Tx, to the antenna terminal Ant. The receive filter 82 outputs signals within the receive band, among signals input to the antenna terminal Ant, to the receive terminal Rx. At least one of the transmit filter 80 and the receive filter 82 may be the ladder-type filter of any one of the first embodiment and the variations thereof.

Figure 12:
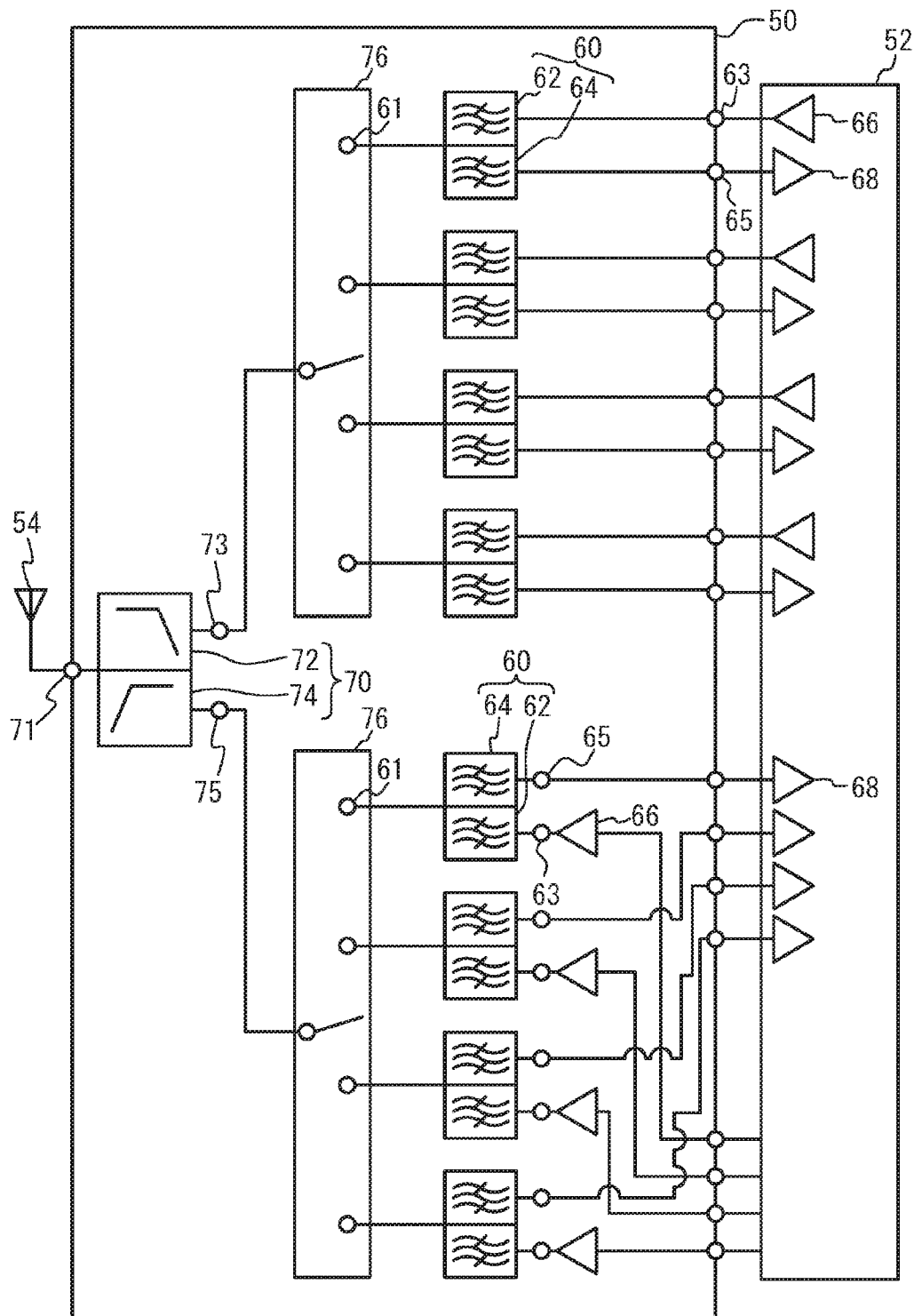
FIG. 12 is a block diagram of a system including a module in accordance with a first variation of the second embodiment.

FIG. 12 is a block diagram of a system including a module in accordance with the first variation of the second embodiment. As illustrated in FIG. 12, the system includes a module 50, an integrated circuit 52, and an antenna 54. The module 50 includes a diplexer 70, switches 76, duplexers 60, and power amplifiers 66. The diplexer 70 includes a low-pass filter (LPF) 72 and a high-pass filter (HPF) 74. The LPF 72 is connected between terminals 71 and 73. The HPF 74 is connected between terminals 71 and 75. The terminal 71 is connected to the antenna 54. The LPF 72 passes low-frequency signals of signals transmitted/received to/from the antenna 54, and suppresses high-frequency signals. The HPF 74 passes high-frequency signals of signals transmitted/received to/from the antenna 54, and suppresses low-frequency signals.

The switch 76 connects the terminal 73 or 75 to one of terminals 61. The duplexer 60 includes a transmit filter 62 and a receive filter 64. The transmit filter 62 is connected between terminals 61 and 63. The receive filter 64 is connected between terminals 61 and 65. The transmit filter 62 passes signals within the transmit band, and suppresses other signals. The receive filter 64 passes signals within the receive band, and suppresses other signals. The power amplifier 66 amplifies and outputs transmission signals to the terminal 63. A low noise amplifier 68 amplifies reception signals output to the terminal 65.

The filter of any one of the first embodiment and the variations thereof can be used for at least one of the transmit filter 62 and the receive filter 64 of the duplexer 60. The first variation of the second embodiment describes a front end module for mobile communication terminals as an example of a module, but the module may be other types of module.

In the embodiment, a surface acoustic wave resonator is mainly described as an example of a resonator, but the resonator may be a boundary acoustic wave resonator, a Love wave resonator, or a piezoelectric thin film resonator.

Although the embodiments of the present invention have been described in detail, it is to be understood that the various change, substitutions, and alterations could be made hereto without departing from the spirit and scope of the invention.

What is claimed is:

1. A ladder-type filter comprising:
   one or more series resonators connected in series between an input terminal and an output terminal;
   three or more parallel resonators connected in parallel between the input terminal and the output terminal; and
   a path that electrically connects ground terminals of the three or more parallel resonators to each other, electrically connects to ground through only a ground terminal of a parallel resonator located closest to the input terminal or to the output terminal, and includes at least two inductors connected in series in at least two positions of positions between the ground terminals of the three or more parallel resonators,
   wherein the at least two inductors include a first inductor and a second inductor located closer to the ground than the first inductor and has an inductance less than an inductance of the first inductor.

2. The ladder-type filter according to claim 1, wherein an inductor located closest to the ground of the at least two inductors has an inductance less than an inductance of an inductor located farthest from the ground.

3. The ladder-type filter according to claim 1, wherein
the path includes a third inductor connected in series between the ground terminal of the parallel resonator located closest to the input terminal or to the output terminal and the ground.

4. The ladder-type filter according to claim 1, wherein
the path includes a third inductor connected in series between the ground terminal of the parallel resonator located closest to the input terminal or to the output terminal and the ground, and
the third inductor has an inductance less than an inductance of the second inductor.

5. The ladder-type filter according to claim 1, wherein
an inductor located closer to the ground of adjacent inductors has an inductance less than an inductance of another inductor of the adjacent inductors with respect to all adjacent inductors of the at least two inductors connected in series between the ground terminals of the three or more parallel resonators.

6. The ladder-type filter according to claim 1, wherein
a number of the three or more parallel resonators is four or greater.

7. A duplexer comprising:
a transmit filter; and
a receive filter,
wherein at least one of the transmit filter and the receive filter is a ladder type filter, and
the ladder type filter comprising:
   one or more series resonators connected in series between an input terminal and an output terminal;
   three or more parallel resonators connected in parallel between the input terminal and the output terminal; and
   a path that electrically connects ground terminals of the three or more parallel resonators to each other, electrically connects to ground through only a ground terminal of a parallel resonator located closest to the input terminal or to the output terminal, and includes at least two inductors connected in series in at least two positions of positions between the ground terminals of the three or more parallel resonators,
wherein the at least two inductors include a first inductor and a second inductor located closer to the ground than the first inductor and has an inductance less than an inductance of the first inductor.

8. A module comprising:
at least one of a ladder-type filter and a duplexer,
wherein the duplexer includes a transmit filter and a receive filter,
at least one of the transmit filter and the receive filter is the ladder-type filter, and
the ladder-type filter comprising:
   one or more series resonators connected in series between an input terminal and an output terminal;
   three or more parallel resonators connected in parallel between the input terminal and the output terminal; and
   a path that electrically connects ground terminals of the three or more parallel resonators to each other, electrically connects to ground through only a ground terminal of a parallel resonator located closest to the input terminal or to the output terminal, and includes at least two inductors connected in series in at least two positions of positions between the ground terminals of the three or more parallel resonators,
wherein the at least two inductors include a first inductor and a second inductor located closer to the ground than the first inductor and has an inductance less than an inductance of the first inductor.

* * * * *